United States Patent
Bae et al.

(10) Patent No.: US 7,348,655 B2
(45) Date of Patent: Mar. 25, 2008

(54) ORGANIC ELECTRO LUMINESCENCE DEVICE AND FABRICATION METHOD THEREOF

(75) Inventors: Sung Joon Bae, Seongnam-si (KR); Jae Yoon Lee, Seoul (KR)

(73) Assignee: LG. Philips LCD. Co., Ltd, Seoul (KR)

( * ) Notice: Subject to any disclaimer, the term of this patent is extended or adjusted under 35 U.S.C. 154(b) by 222 days.

(21) Appl. No.: 11/119,521

(22) Filed: Apr. 29, 2005

(65) Prior Publication Data

US 2005/0242350 A1    Nov. 3, 2005

(30) Foreign Application Priority Data

Apr. 30, 2004    (KR) .................. 10-2004-0030790

(51) Int. Cl.
*H01L 29/04* (2006.01)
*H01L 29/15* (2006.01)

(52) U.S. Cl. .................. 257/528; 257/59; 257/72; 257/E51.005; 438/48; 438/128; 438/149; 438/151; 438/157; 438/283

(58) Field of Classification Search .................. 257/59, 257/72, E51.005; 438/48, 128, 149, 151, 438/157, 283
See application file for complete search history.

(56) References Cited

U.S. PATENT DOCUMENTS 6,175,345 B1    1/2001    Kuribayashi et al.
6,548,961 B2    4/2003    Barth et al.
6,919,680 B2    7/2005    Shimoda et al.
2002/0134979 A1 *    9/2002    Yamazaki et al. ............. 257/59
2003/0234424 A1 *    12/2003    Suzawa et al. ............. 257/347

FOREIGN PATENT DOCUMENTS

| JP | 2001-117509 | 4/2001 |
|----|----|----|
| KR | 0365519 | 12/2006 |
| WO | WO 02078101 | 10/2002 |

* cited by examiner

*Primary Examiner*—Kenneth Parker
*Assistant Examiner*—Joseph Nguyen
(74) *Attorney, Agent, or Firm*—Brinks Hofer Gilson & Lione

(57) ABSTRACT

An organic electro luminescence device is provided. A thin film transistor (TFT) is formed within a sub-pixel region defined by a gate line and a data line on a substrate. A passivation layer and a first electrode are sequentially formed on the substrate where the TFT is formed. A contact hole is formed at a predetermined portion of the passivation layer and the first electrode so as to expose a drain electrode of the TFT. An electrode separator and a buffer layer are misaligned with the gate line by a predetermined position, such that an emission region corresponding to the sub-pixel and a region including the contact hole of the TFT are separated. An organic electro luminescent layer is formed within a region defined by the buffer region. A second electrode is formed on the organic electrode luminescent layer and is connected to the drain electrode of the TFT through the contact hole.

22 Claims, 8 Drawing Sheets

ORGANIC ELECTRO LUMINESCENCE DEVICE AND FABRICATION METHOD THEREOF

PRIORITY CLAIM

The present application claims the benefit of Korean Application No. 2004-30790 filed on Apr. 30, 2004, which is hereby incorporated by reference.

FIELD OF THE INVENTION

The present invention relates to an organic electro luminescence device and a fabrication method thereof, and more particularly, to an organic electro luminescence device using a-Si TFT as a driving element and a fabrication method thereof.

DESCRIPTION OF THE RELATED ART

In the fields of flat panel display devices, a liquid crystal display device (LCD) is widely used because it is lightweight and has low power consumption. However, the LCD is a non-luminous display device and has technical limitations in brightness, contrast, viewing angle, and large size. Therefore, new flat panel display devices capable of overcoming these drawbacks have been developed actively.

One of the new flat panel display devices is an organic electro luminescence device. Since the organic electro luminescence device is a self-luminous display device, it has a high contrast and wide viewing angle compared with the LCD. Also, since the organic electro luminescence device does not require a backlight assembly, it is lightweight and slim. In addition, the organic electro luminescence device can decrease power consumption.

Further, the organic electro luminescence device can be driven at a low DC voltage and has a fast response speed. Since all of the components of the organic electro luminescence device are formed of solid materials, it is endurable against external impact. It can also be used in a wide temperature range and can be manufacture at a low cost.

Specifically, the organic electro luminescence device is easily fabricated through a deposition process and an encapsulation process. Therefore, the fabrication method and apparatus of the organic electro luminescence device are simpler than those of an LCD or PDP.

If the organic electro luminescence device is driven in an active matrix type, uniform brightness can be obtained even when a low current is applied. Accordingly, the organic electro luminescence device has advantages of low power consumption, high definition and large-sized screen.

A basic structure and operation characteristic of an active matrix type organic electro luminescence device (AMOLED) will now be described with reference to the accompanying drawing.

FIG. 1 is a circuit diagram illustrating a basic pixel structure of a related art active matrix type organic electro luminescence device. Referring to FIG. 1, gate lines (GL) 2 are formed in a first direction and data lines (DL) 3 and power lines (VDD) 4 are formed in a second direction intersecting the first direction to define each sub-pixel region.

A switching TFT 5 serving as an addressing element is formed on each intersection of the gate and data lines 2 and 3. A storage capacitor ($C_{st}$) 6 is connected to the switching TFT 5 and the power line 4. A drive TFT 7 serving as a current source element is connected to the storage capacitor ($C_{ST}$) 6 and the power line 4. An organic electro luminescent diode 8 is connected to the drive TFT 7.

When a forward current is applied to the organic light emitting material, electrons and holes are recombined, moving through a P-N junction between an anode electrode as a hole donor and a cathode electrode as an electron donor. Therefore, the energy of the organic electro luminescent diode 8 becomes lower than that created when the electrons are separated from the holes. At this point, light is emitted due to the energy difference.

That is, each sub-pixel of the AMOLED includes the switching TFT 5 and the drive TFT 7. The switching TFT 5 addresses a pixel voltage that is a gate driving voltage, and the drive TFT 7 controls a driving current of the AMOLED. Also, the storage capacitor 6 for maintaining the pixel voltage stably is necessarily required.

The organic electro luminescence device may be classified into a top emission type and a bottom emission type depending on a traveling direction of the light emitted from the organic electro luminescent diode.

The TFT used in the AMOLED is classified into an amorphous silicon (a-Si) TFT and a polysilicon (p-Si) TFT depending on states of a semiconductor thin film serving as an active channel. In recent years, much effort has been expended to use a p-Si TFT having high field effect mobility in the AMOLED. However, usually an a-Si TFT is used in the AMOLED.

FIG. 1 is a circuit diagram of an AMOLED using an a-Si TFT. As shown in FIG. 1, since the TFT is an n-type TFT, the organic electro luminescent diode is connected to a source electrode S of the drive TFT and the power line 4 is connected to a drain electrode D of the drive TFT 7.

FIG. 2 is a sectional view of a related art bottom emission type AMOLED. As shown in FIG. 2, a related art bottom emission type AMOLED includes a TFT array 14 formed on a first transparent substrate 12, an anode 16, an organic luminescent layer 18 and a cathode 20, which are formed on the TFT array 14 in sequence. The anode 16, the organic luminescent layer 18 and the cathode 20 configure an organic luminescent diode.

The organic luminescent layer 18 reproduces red R, green G and blue B colors. For example, organic material emitting R, G and B colors are patterned on each pixel P. This may be configured with multiple organic layers. That is, the organic luminescent layer formed between the anode and the cathode can be provided by stacking a hole injection layer (HIL), a hole transporting layer (HTL), an emission layer (EML), and an electron transporting layer (ETL) in sequence.

The organic electro luminescence device is encapsulated by attaching the first substrate 12 to the second substrate 28 having an absorbent 22 by a sealant 26. The absorbent 22 removes moisture and oxygen that may infiltrate into the encapsulated organic electro luminescence device. A portion of the substrate 28 is etched and the absorbent 22 is filled in the etched portion and fixed using tape 25.

FIG. 3 is a sectional view of the TFT array of the related art AMOLED shown in FIGS. 1 and 2. Specifically, there is shown a region including the drive TFT of the TFT array. Generally, for the AMOLED, each pixel of the TFT array formed on the substrate is provided with a switching element, a driving element and a storage capacitor. According to the operation characteristic, the switching element or the driving element can be configured with a combination of more than one TFT.

The switching TFT $T_S$ and the drive TFT $T_D$ can be a TFT having a gate electrode, an active layer, a source electrode, and a drain electrode. The TFT used in the AMOLED is classified into an amorphous silicon (a-Si) TFT and a polysilicon (p-Si) TFT depending on states of a semiconductor thin film serving as an active channel.

An a-Si TFT is applied to the AMOLED shown in FIG. 1. As shown in FIG. 3, since the TFT is an n-type TFT, an anode of the organic electro luminescent diode is connected to a source electrode S of the drive TFT. Referring to FIG. 3, the drive TFT $T_D$ includes a gate electrode 30, a gate insulating layer 31, and source/drain electrodes 33 and 34. An active layer 32 is interposed between the source electrode 33 and the drain electrode 34. A passivation layer 35 is disposed on the first transparent substrate 12 containing the TFT.

Also, the pixel region includes an anode 36 connected to the source electrode 33, an organic electro luminescent layer 38 formed on the anode 36 in a multi-layer or single-layer structure, and a cathode 39 for injecting electrons into the organic electro luminescent layer 38. The anode 36 functions to inject holes into the organic electro luminescent layer 38. When the organic electro luminescent layer 38 is configured in a multi-layer structure, it may include the hole injection layer (HIL), the hole transporting layer (HTL), the emission layer (EML), and the electron transporting layer (ETL).

The pixel regions are arranged in a matrix. The pixel regions are separated from one another by electrode separators 37. That is, in the related art AMOLED, the anode 36 formed on the pixel region having the drive TFT $T_D$ is connected to the source electrode 33 of the drive TFT $T_D$. The electrode separator 37 is formed on the anode 36 and separates the sub-pixel regions. The organic electro luminescent layer 38 including the hole injection layer (HIL), the hole transporting layer (HTL), the emission layer (EML) and the electron transporting layer (ETL) is formed within the electrode separators 37. The cathode 39 is formed as an opposite electrode on the organic electro luminescent layer 38.

As shown in FIGS. 1 and 3, in the related art AMOLED using the a-Si TFT as the drive TFT, the anode 36 of the organic electro luminescent layer is connected to the source electrode 33 of the drive TFT $T_D$, and the organic electro luminescent layer 38 and the cathode 39 are formed on the anode 36.

That is, the anode 36 of the organic electro luminescent diode is connected to the source electrode 33 of the drive TFT $T_D$ and serves as the pixel electrode. The cathode 39 serves as the opposite electrode, that is, the common electrode. This structure is contrary to a structure where the cathode and the anode are used as the pixel electrode and the common electrode, respectively.

Accordingly, when the pixels of the AMOLED are configured in the above-described structure, the circuit becomes unstable due to the problem of the circuit configuration, thus causing a driving failure.

SUMMARY OF THE INVENTION

By way of introduction only, in one embodiment an active matrix type organic electro luminescence device (AMOLED), a thin film transistor (TFT) for a driving element of each pixel is configured with an a-Si TFT. A second electrode of an organic electro luminescent diode is connected to a drain electrode of a drive TFT and thus permitting the organic electro luminescent diode to use a conventional EL structure. Therefore, the organic electro luminescent device can be driven easily and stably.

In another embodiment, an organic electro luminescence device and a fabrication method thereof are provided in which a sub-pixel region determined by gate lines and data lines is misaligned with a corresponding emission region by a predetermined position, such that the degree of freedom and the design margin of a contact hole for connecting a drive TFT and a second electrode of the organic electro luminescent diode can be improved.

In another embodiment, an organic electro luminescence device is provided that includes a thin film transistor (TFT) formed within a sub-pixel region defined gate and data lines on a substrate. A passivation layer and a first electrode are sequentially formed on the substrate where the TFT is formed. A contact hole is formed on the passivation layer and the first electrode so as to expose a drain electrode of the TFT. An electrode separator and a buffer layer are misaligned with the gate line by a predetermined position such that an emission region corresponding to the sub-pixel and a region including the contact hole of the TFT are separated. An organic electro luminescent layer is formed within a region defined by the buffer region. A second electrode is formed on the organic electrode luminescent layer and is connected to the drain electrode of the TFT through the contact hole.

In another embodiment, an organic electro luminescence device includes a substrate containing gate and data lines defining a sub-pixel region. A thin film transistor (TFT) is formed in the sub-pixel region. A passivation layer is formed on the substrate in the sub-pixel region. A first electrode is formed on the passivation layer in the sub-pixel region. A buffer layer is formed on the first electrode. Adjacent buffer layers define an emission region within the sub-pixel region. An organic electro luminescent layer is formed on the first electrode within the emission region. A contact hole is disposed in a contact region exposing a drain electrode of the TFT through the buffer layer and passivation layer. A second electrode is formed on the organic electrode luminescent layer and the buffer layer. The second electrode is connected to the drain electrode of the TFT through the contact hole.

An electrode separator is disposed on the buffer layer over the gate lines, data lines, and/or TFT. The electrode separator separates adjacent second electrodes. A single emission region or multiple emission regions can be formed within the sub-pixel region or the region bounded by the electrode separator. The emission region may overlap an adjacent sub-pixel region.

In another aspect of the present invention, a fabrication method of an organic electro luminescence device is provided. The fabrication method includes forming a thin film transistor (TFT) within a sub-pixel region defined by gate and data lines on a substrate; sequentially forming a passivation layer and a first electrode on the substrate; forming a contact hole in the passivation layer and the first electrode so as to expose a drain electrode of the TFT in a contact region; forming a buffer layer on the first electrode such that ends of the first electrode are covered by the buffer layer; forming an organic electro luminescent layer within an emission region defined by the buffer region; and forming a second electrode on the organic electrode luminescent layer, the second electrode being connected to the drain electrode of the TFT through the contact hole.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 4:
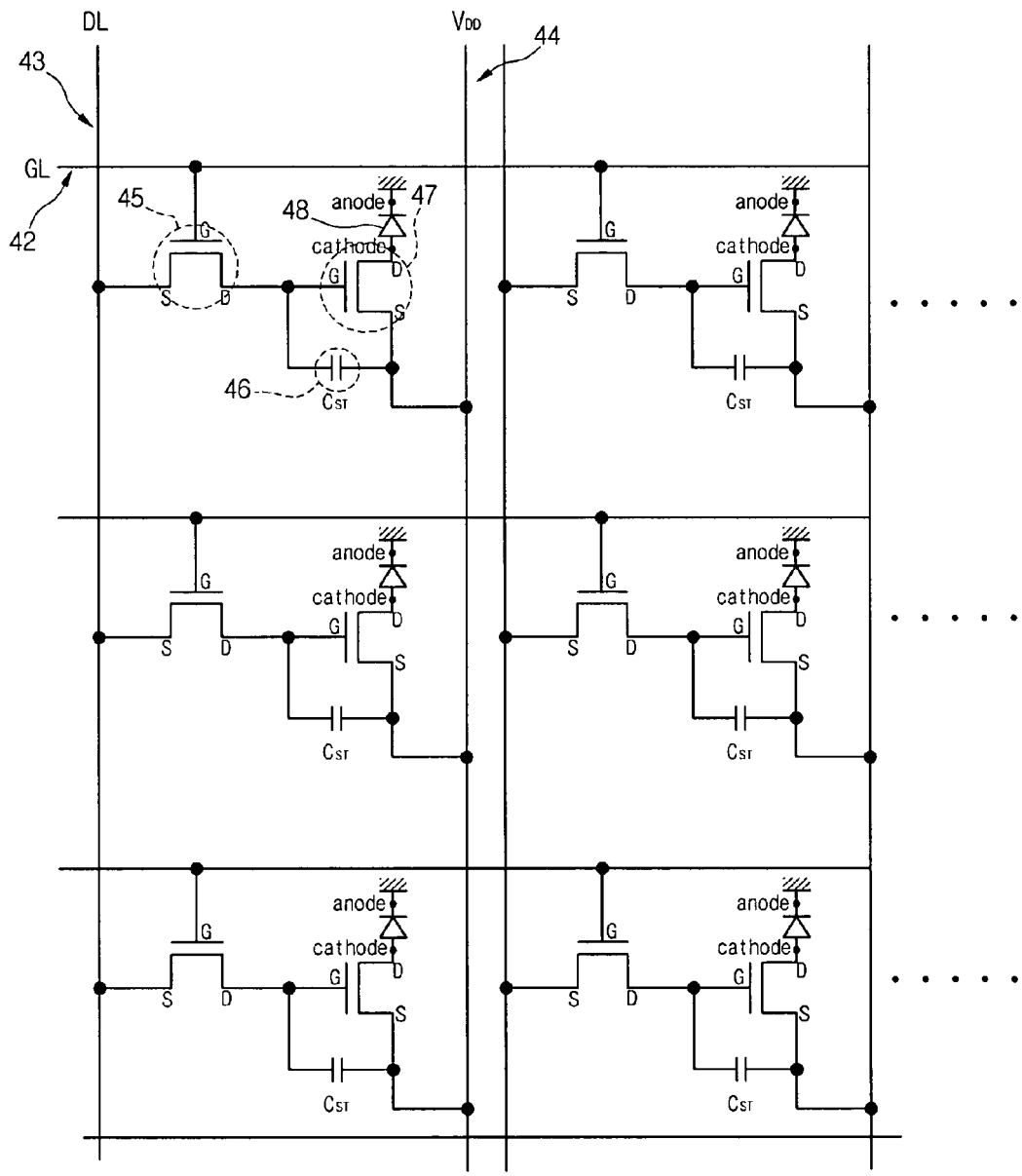
FIG. 4 is a circuit diagram illustrating a basic pixel structure of an AMOLED according to an embodiment of the present invention.

FIG. 4 is a circuit diagram illustrating a basic pixel structure of an AMOLED according to an embodiment of the present invention. Referring to FIG. 4, gate lines (GL) 42 are formed in a first direction and data lines (DL) 43 and power lines (VDD) 44 are formed in a second direction intersecting the first direction to define each sub-pixel region.

A switching TFT 45 serving as an addressing element is formed on each intersection of the gate and data lines 42 and 43. A storage capacitor ($C_{st}$) 46 is connected to the switching TFT 45 and the power line 44. A drive TFT 47 serving as a current source element is connected to the storage capacitor ($C_{ST}$) 46 and the power line 44. An organic electro luminescent diode 48 is connected to the drive TFT 47.

When a forward current is applied to the organic light emitting material, electrons and holes are recombined, moving through a P-N junction between an anode electrode as a hole donor and a cathode electrode as an electron donor. Therefore, the energy of the organic electro luminescent diode 48 becomes lower than that created when the electrons are separated from the holes. Light is emitted due to the energy difference.

That is, each sub-pixel of the AMOLED includes the switching TFT 45 and the drive TFT 47. The switching TFT 45 addresses a pixel voltage that is a gate driving voltage, and the drive TFT 47 controls a driving current of the AMOLED. Also, a storage capacitor $C_{st}$ maintains the pixel voltage stably.

Figure 1:
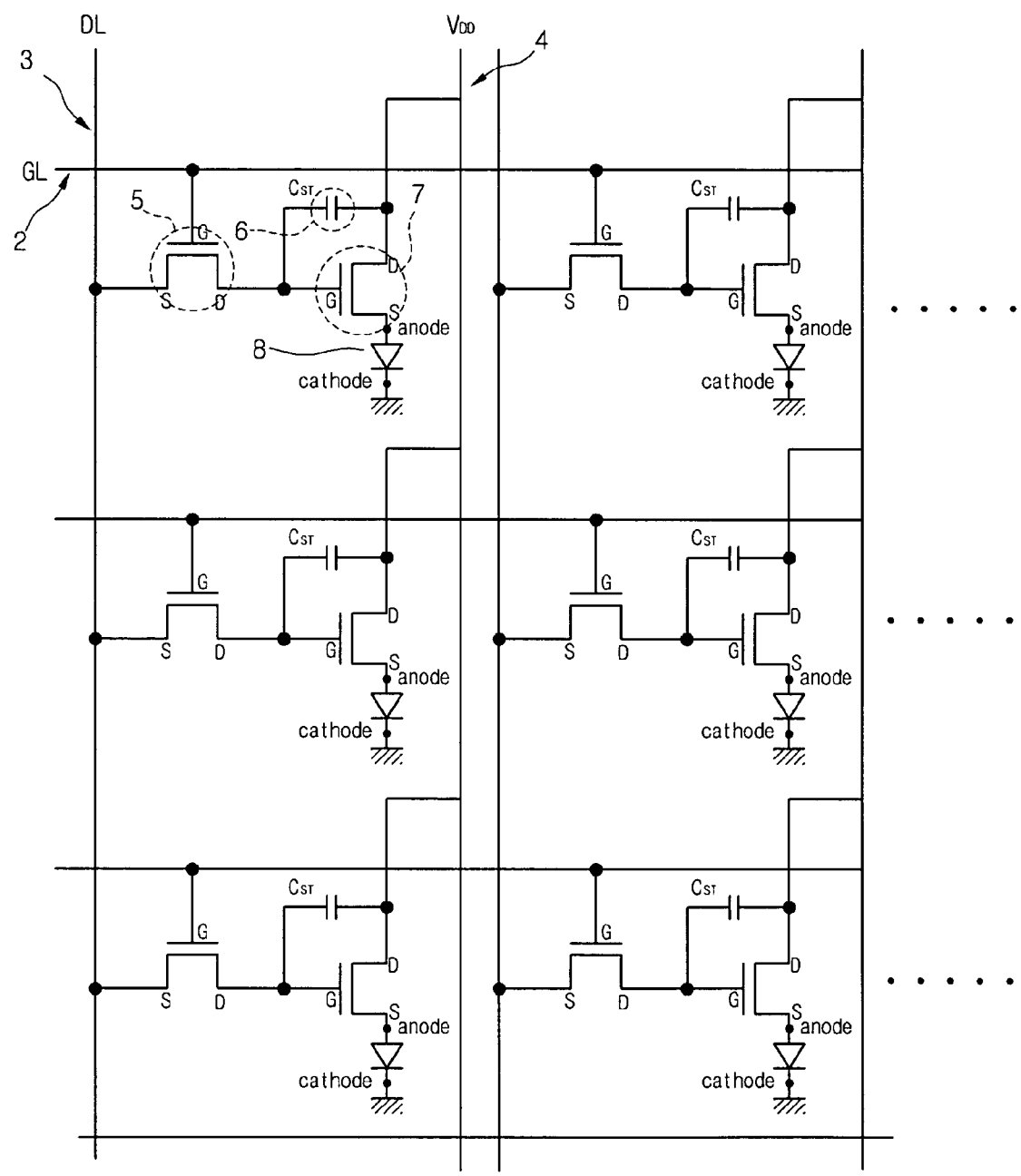
FIG. 1 is a circuit diagram illustrating a basic pixel structure of a related art AMOLED.
Figure 2:
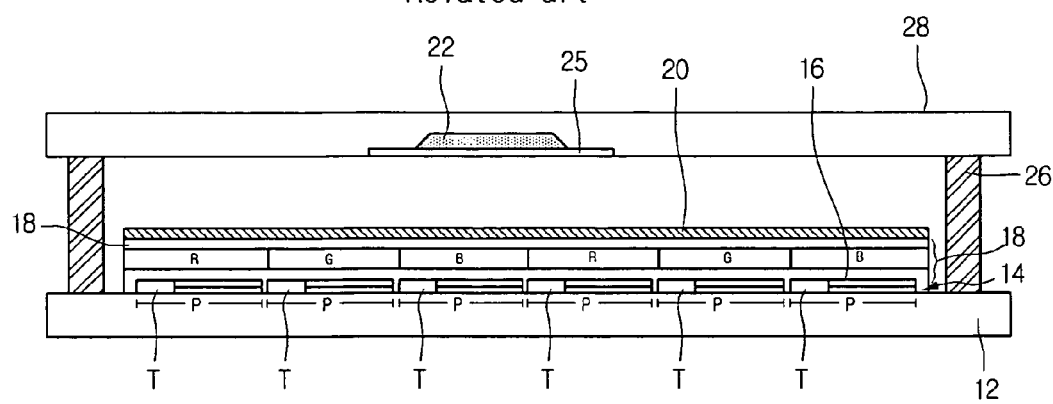
FIG. 2 is a sectional view of a related art AMOLED.
Figure 3:
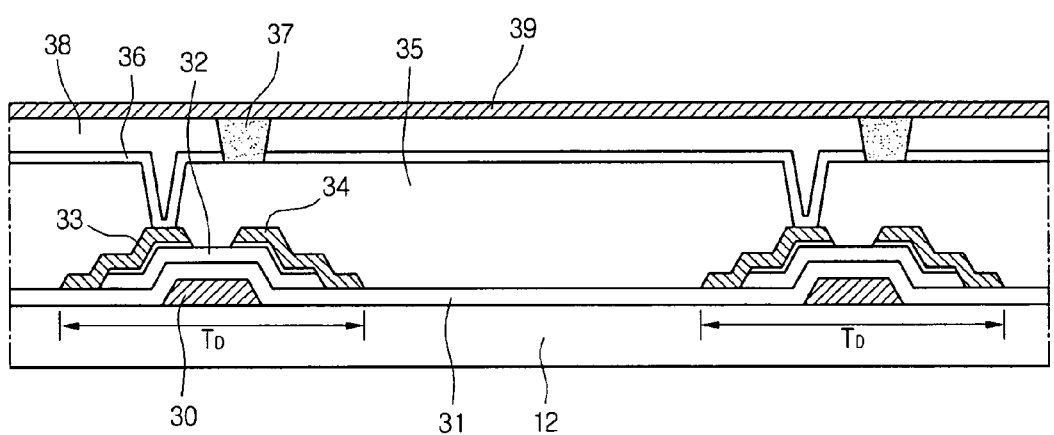
FIG. 3 is a sectional view of a TFT array of the related art AMOLED shown in FIGS. 1 and 2.

Unlike the related art AMOLED shown in FIG. 1, the second electrode (that is, the cathode) of the organic electro luminescent diode is connected to the drain electrode D of the drive TFT 47. Accordingly, the power line 44 is connected to the source electrode S of the drive TFT 47.

The drive TFT 47 is configured with an n-type a-Si TFT where an active layer is formed using amorphous silicon. Similarly, the TFT for a driving element of each pixel is configured with an a-Si TFT and the second electrode (cathode) of the organic electro luminescent diode is connected to the drain electrode D of the drive TFT 47, thereby providing a stable driving operation of the organic electro luminescence device.

In this embodiment, the second electrode (cathode) of the organic electro luminescent diode is connected to the drain electrode D of the drive TFT 47 and serves as the pixel electrode. Also, the first electrode (anode) of the organic electro luminescent diode serves as an opposite electrode, that is, the common electrode. The circuit configuration is stable and thus the AMOLED can be driven stably.

When the TFT for the driving element of each pixel is configured with an a-Si TFT, mobility of the amorphous silicon is lower than that of crystalline silicon by 0.5-1 $cm^2/Vsec$. In order to drive the organic electro luminescent layer, a ratio of width to length (W/L ratio) of the drive TFT is large. In order to increase the W/L ratio of the drive TFT, the size of the drive TFT is large. If the size of the drive TFT $T_D$ increases, the aperture ratio of the bottom emission type organic electro luminescent device decreases.

Figure 5:
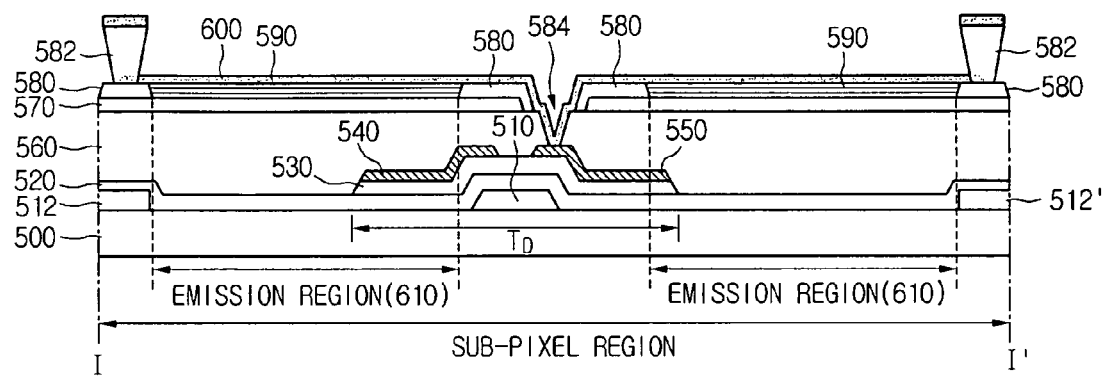
FIG. 5 is a sectional view of a TFT array of an AMOLED according to an embodiment of the present invention.
Figure 6:
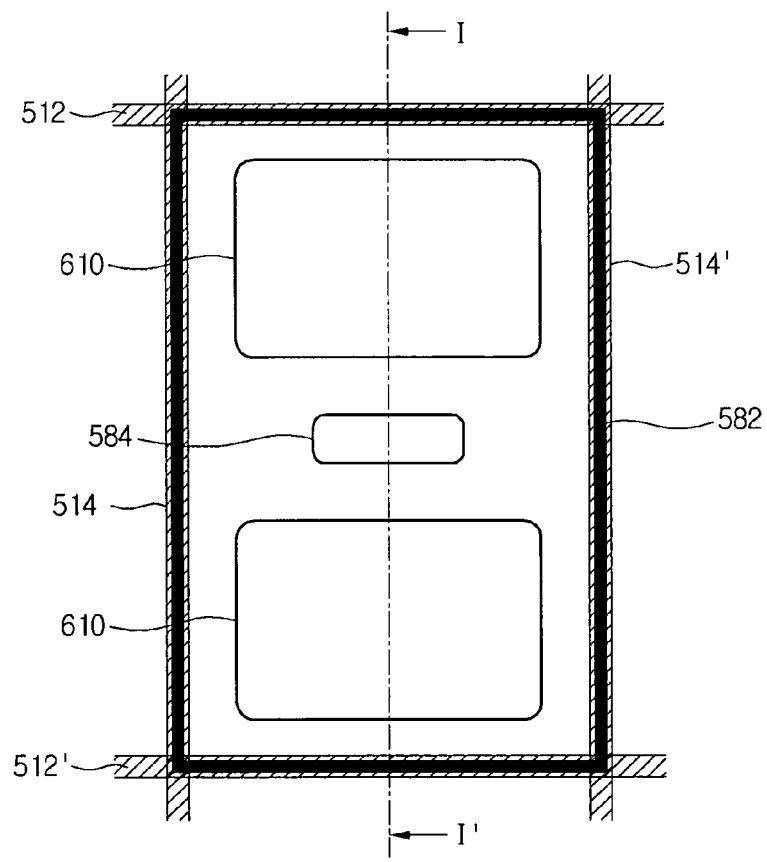
FIG. 6 is a plan view of the AMOLED shown in FIG. 5.

Accordingly, in another embodiment the organic electro luminescence device using the a-Si TFTs is a bottom emission type, not a top emission type AMOLED. FIG. 5 is a sectional view of a TFT array of an AMOLED according to an embodiment of the present invention. A region including the drive TFT of the TFT array is shown in FIG. 5. FIG. 6 is a plan view of the AMOLED shown in FIG. 5, and FIG. 5 is a sectional view taken along line I-I' of FIG. 6.

In this embodiment, the second electrode (cathode), not the first electrode (anode), of the organic electro luminescent diode is connected to the drain electrode of the drive TFT. Also, the organic electro luminescent diode has a conventional EL structure, not an inverted EL structure.

According to the conventional EL structure, the organic electro luminescent diode is provided by sequentially forming a first electrode (anode), a hole injection layer (HIL), a hole transporting layer (HTL), an emission layer (EML), an electron transporting layer (ETL), and a second electrode (cathode) in this order.

On the contrary, according to the inverted EL structure, the organic electro luminescent diode is provided by sequentially forming a second electrode (cathode), an electron transporting layer (ETL), an emission layer (EML), a hole transporting layer (HTL), a hole injection layer (HIL), and a first electrode (anode) in this order.

The inverted EL structure has been proposed to solve the unstable driving of the AMOLED. In such an inverted EL structure, however, the organic electro luminescent layer and a surface of the anode are susceptible to damage and the device characteristic may be affected.

In the related art AMOLED is configured in the conventional EL structure where the first electrode of the organic electro luminescent diode is connected to the source electrode of the drive TFT. On the contrary, the present AMOLED maintains the conventional EL structure but connects the second electrode of the organic electro luminescent diode to the drain electrode of the drive TFT.

Each pixel P of the TFT array formed on the substrate is provided with a switching element, a driving element and a storage capacitor (not shown). According to the operation characteristic, the switching element or the driving element can be configured with a combination of more than one TFT. The AMOLED shown in FIG. 5 is an AMOLED using an a-Si TFT. In this case, the drive TFT is an n-type TFT.

For the related art AMOLED, when the drive TFT is a n-type a-Si TFT, the first electrode of the organic electro luminescent diode is connected to the source electrode of the drive TFT. Therefore, the driving of the device is not stable. On the contrary, the present invention can solve the problem by connecting the second electrode of the organic electro luminescent diode to the drain electrode of the drive TFT while maintaining the conventional EL structure.

Referring to FIGS. 5 and 6, the drive TFTs $T_D$ is formed within a sub-pixel region defined by gate lines 512 and 512' and data lines 514 and 514'. The drive TFT $T_D$ includes a gate electrode 510, a gate insulating layer 520, and source/drain electrodes 540 and 550. The active layer 530 is formed between the source electrode 540 and the drain electrode 550.

The emission region 610 is formed within the sub-pixel region and includes a second electrode 600 of the organic electro luminescent diode, which is connected to the drain electrode 550, an organic electro luminescent layer 590 formed below the second electrode 600 in a multi-layer or single-layer structure, and a first electrode 570 for injecting holes into the organic electro luminescent layer 590.

In this embodiment, the conventional EL structure is applied when the organic electro luminescent diode is formed. That is, the organic electro luminescent diode is provided by forming the first electrode 570, the organic electro luminescent layer 590, and the cathode 600 in sequence. Alternatively, the electrode connected to the drain electrode 550 of the drive TFT $T_D$ is used as the second electrode 600.

Also, when the organic electro luminescent layer 590 is configured in a multi-layer structure, the hole injection layer (HIL), the hole transporting layer (HTL), the emission layer (EML), and the electron transporting layer (ETL) can be sequentially formed on the first electrode 570.

The sub-pixel region is defined by the gate lines 512 and 512' and the data lines 514 and 514' and is arranged in a matrix. The emission region 610 is formed within the sub-pixel region.

A buffer layer 580 is provided at an outer region where the organic electro luminescent layer 590 is formed within the sub-pixel region, such that the organic electro luminescent layer 590 is not formed at a region in which the buffer layer 580 is formed. The buffer layer 580 defines the emission region 610 within the sub-pixel. The electrode separator 582 is formed at a predetermined region of an upper portion of the buffer layer 580 and separates the sub-pixel regions. That is, the sub-pixel regions are separated from one another by the electrode separators 582. The electrode separators 582 are formed at regions where the gate lines 512 and 512' and the data lines 514 and 514' are overlapped.

In the AMOLED shown, the first electrode (the anode of the organic electro luminescent diode) 570 is entirely formed as the common electrode on the substrate 500 having the drive TFT $T_D$. A contact hole 584 is formed on the first electrode of the drain electrode 550 and the passivation layer 560 so as to expose the drain electrode 550 of the drive TFT $T_D$. The buffer 580 and the electrode separator 582 are formed on a predetermined region of the first electrode 570. The organic electro luminescent layer 590 including the hole injection layer (HIL), the hole transporting layer (HTL), the emission layer (EML) and the electron transporting layer (ETL) is formed on the emission region 610 defined by the buffer layer 580 among the sub-pixel region between the electrode separators 582. Then, the second electrode 600 serving as the pixel electrode is formed such that the second electrode 600 and the drain electrode 550 are connected together through the contact hole 584.

The second electrode 600 is divided in each sub-pixel region by the electrode separators 582. The first electrode 570 is formed on an entire surface of the substrate except the region where the contact hole 584 is formed, such that it is connected pixel-to-pixel.

According to the present invention, the TFTs for the driving element of each sub-pixel is configured with an a-Si TFT and the drain electrode of the drive TFT is connected to the second electrode (cathode) of the organic electro luminescent diode, thereby providing the stable driving of the organic electro luminescence device.

Meanwhile, as shown in FIGS. 5 and 6, when the contact hole is formed at the center of the sub-pixel region, the emission region is divided. Consequently, the emission region is reduced.

Figure 7:
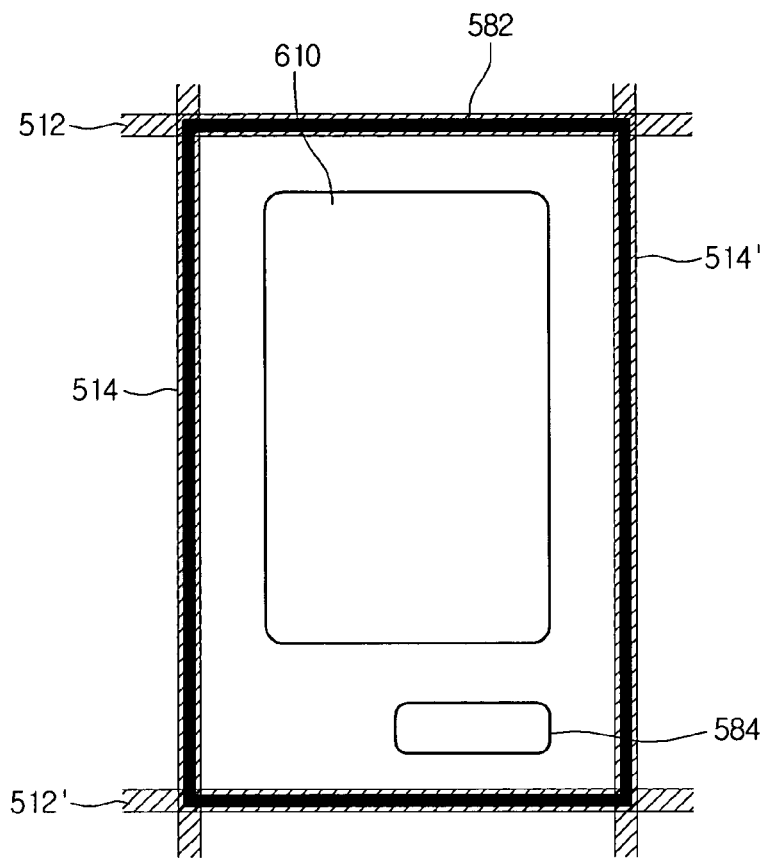
FIG. 7 is a plan view of an AMOLED according to another embodiment of the present invention.

FIG. 7 is a plan view of an AMOLED according to another embodiment of the present invention. It can be seen that the contact hole is formed at one end portion of the sub-pixel.

Referring to FIG. 7, the emission region 610 is included in the sub-pixel region. Reduction of the emission region when the contact hole 584 is formed at one end portion of the sub-pixel, as shown in FIGS. 5 and 6, can be solved. However, due to the restricted position setting of the contact hole, the degree of freedom and the design margin of the contact hole for connecting the drive TFT and the second electrode of the organic electro luminescence diode are degraded. That is, the problem cannot be solved when the emission region 610 is formed within the sub-pixel region defined by the gate lines 512 and 512' and the data lines 514 and 514'.

In order to solve this problem, the sub-pixel region defined by the gate lines and the data lines and the corresponding emission region are formed to be misaligned by a predetermined position. In this manner, the restrictive factor of the design can be overcome. Also, the degree of freedom and the design margin of the contact hole 884 for connecting the drive TFT and the second electrode of the organic electro luminescence diode can be improved.

Figure 8:
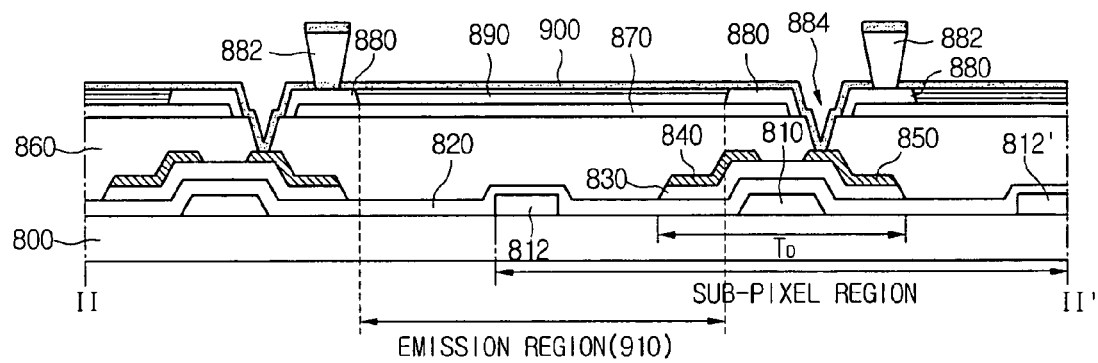
FIG. 8 is a sectional view of a TFT array of an AMOLED according to another embodiment of the present invention.
Figure 9:
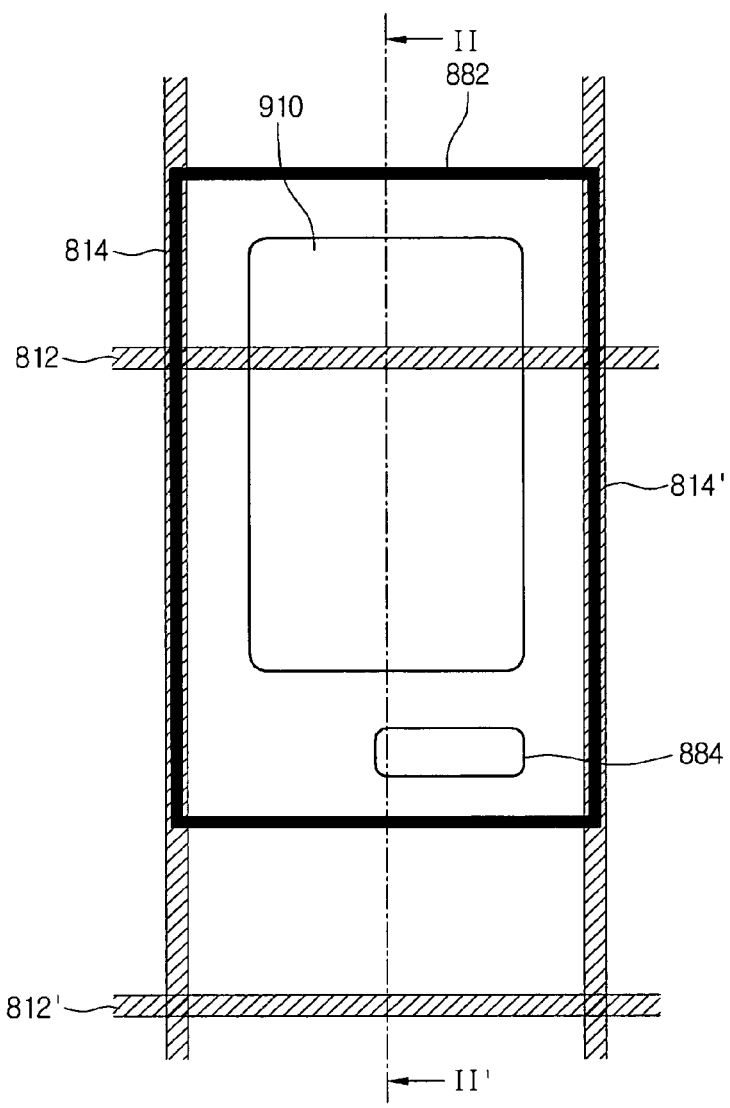
FIG. 9 is a plan view of the AMOLED shown in FIG. 8.

FIG. 8 is a sectional view of a TFT array of an AMOLED according to another embodiment of the present invention. A region including a driving TFT of the TFT array is shown in FIG. 8. Also, FIG. 9 is a plan view of the AMOLED shown in FIG. 8, and FIG. 8 is a sectional view taken along line I-I'.

Although the contact hole 884 for exposing the drain electrode 850 the drive TFT $T_D$ is formed at the central portion of the sub-pixel region, the emission region 910 where the organic electro luminescent layer 890 is formed is not limited to the region within the sub-pixel. Since the emission region 910 is overlapped with an adjacent sub-pixel region disposed upward from the sub-pixel, the emission region 910 is not divided, thereby preventing the reduction of the emission region.

Also, since the contact hole 884 need not be formed on one end portion of the sub-pixel region, the design margin of the contact hole and the degree of freedom can be improved.

Consequently, the sub-pixel region defined by the gate lines 812 and 812' and the data lines 814 and 814' and the corresponding emission region 910 are misaligned by a predetermined position. In this manner, the degree of freedom and the design margin of the contact hole 884 for connecting the drive TFT $T_D$ and the second electrode 900 of the organic electro luminescent diode can be improved without reducing the emission region 910.

Referring to FIGS. 8 and 9, the drive TFTs $T_D$ is formed within a sub-pixel region defined by gate lines 812 and 812' and data lines 814 and 814'. The drive TFT $T_D$ includes a gate electrode 810, a gate insulating layer 820, and source/drain electrodes 840 and 850. The active layer 830 is formed between the source electrode 840 and the drain electrode 850.

The formation of the emission region 910 is limited to the sub-pixel region. That is, the emission region 910 can be formed to overlap vertically with an adjacent sub-pixel region.

That is, the emission region 910 is not limited to the pixel region having the drive TFT $T_D$ that provides a predetermined signal to the second electrode 900 of the organic electro luminescent diode. The emission region 910 is overlapped with the adjacent sub-pixel region such that the sub-pixel region and the corresponding emission region 910 are misaligned by a predetermined position.

The emission region 910 includes a second electrode 900 of the organic electro luminescent diode, connected to the drain electrode 850 of the drive TFT $T_D$, an organic electro luminescent layer 890 formed below the second electrode 900 in a multi-layer or single-layer structure, and a first electrode 870 for injecting holes into the organic electro luminescent layer 890.

In this embodiment, the conventional EL structure is applied when the organic electro luminescent diode is formed. That is, the organic electro luminescent diode is provided by forming the first electrode 870, the organic electro luminescent layer 890, and the cathode 900 in sequence. Alternatively, the electrode connected to the drain electrode 850 of the drive TFT $T_D$ is used as the second electrode 900.

Although the sub-pixel region is defined by the gate lines 812 and 812' and the data lines 814 and 814' and is arranged in a matrix, each sub-pixel region is not separated by the electrode separator.

Referring to FIG. 8, the first electrode (the anode of the organic electro luminescent diode) 870 is entirely formed as the common electrode on the substrate 800 having the drive TFT $T_D$. The contact hole 884 is formed on the first electrode 870 of the drain electrode 850 and the passivation layer 860 so as to expose the drain electrode 850 of the drive TFT $T_D$. The buffer 880 and the electrode separator 882 are formed on a predetermined region of the first electrode 870. The organic electro luminescent layer 890 including the hole injection layer (HIL), the hole transporting layer (HTL), the emission layer (EML) and the electron transporting layer (ETL) is formed on the emission region 910 defined by the buffer layer 880 among the sub-pixel region between the electrode separators 882. Then, the second electrode 900 serving as the pixel electrode is formed such that the second electrode 900 and the drain electrode 850 are connected together through the contact hole 884.

At this point, as shown in FIGS. 8 and 9, the electrode separator 882 is not formed at the region that is overlapped with the gate lines 812 and 812', but is misaligned with the gate lines 812 and 812' by a predetermined position. In this manner, the emission region 910 and the region including the contact hole 884 of the drive TFT $T_D$ are separated. Thus, the contact hole 884 need not be provided at one side of the sub-pixel region.

Also, the buffer layer 980 defines the region where the organic electro luminescent layer 890 is formed. In this embodiment, the emission region 910 where the organic electro luminescent layer 890 is formed is not limited to the inside of the sub-pixel region where the drive TFT is formed.

The second electrode 900 is separated by the electrode separator 882. The first electrode 870 is formed on an entire surface of the substrate except the region where the contact hole 884 is formed, such that it is connected pixel-to-pixel.

A fabrication method of the AMOLED shown in FIGS. 8 and 9 will be described below in detail with reference to FIG. 10.

FIGS. 10A to 10F are sectional views illustrating a fabrication method of the AMOLED shown in FIGS. 8 and 9. Specifically, a fabrication method of the region including the drive TFT of the TFT array is shown.

Figure 10A:
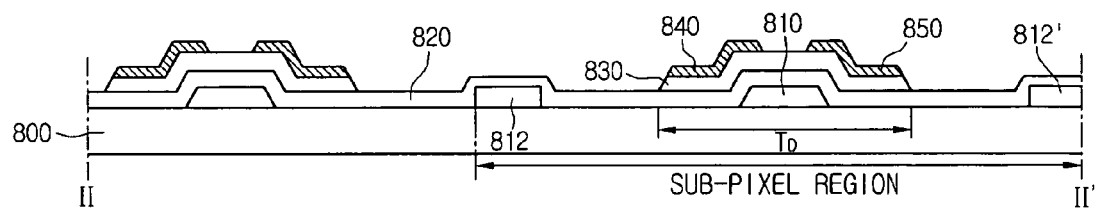
FIGS. 10A to 10F are sectional views illustrating a fabrication method of the AMOLED shown in FIGS. 8 and 9.

Referring to FIG. 10A, a-Si TFT $T_D$ is formed on a substrate 800.

That is, the TFT serving as a switching element or a driving element is formed at a plurality of pixel regions defined in the substrate 800. In FIG. 10A, the drive TFT $T_D$ formed the sub-pixel region is illustrated. The a-Si TFT includes a gate electrode 810, a gate insulating layer 820, an active layer 830, and source/drain electrodes 840 and 850, which are sequentially formed in the sub-pixel region defined by gate lines 812 and 812' and data lines. An active layer 830 is formed of amorphous silicon (a-Si), which is n-type. The TFT is formed using a plurality of mask processes. In recent years, it is usual that a fabricating process is reduced by forming the active layer 830 and the source/drain electrodes 840 and 850 through a single mask process.

Figure 10B:
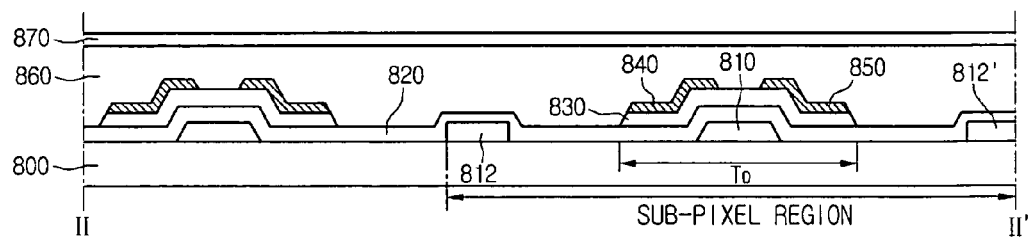

Referring to FIG. 10B, a passivation layer 860 is formed on the substrate 800 where the TFT is formed, and a first electrode (anode) 870 is formed as a common electrode on the passivation layer 860. The passivation layer 860 can be formed of silicon nitride, silicon oxide or BCB, photo acryl, and the like. The first electrode 870 is the anode of the organic electro luminescent diode and can be formed of a transparent conductive material such as indium-tin-oxide (ITO) or a metal material such as chrome (Cr) and aluminum (Al).

As described above, when the a-Si TFT is used, its size becomes large. Therefore, it is usual to employ the top emission type structure instead of a bottom emission type structure. In the selection of the material for the first electrode 870 serving as the common electrode, when the transparent conductive material such as ITO is used, it is preferable to further form a metal layer (not shown) serving as a reflective plate in its lower portion. When metal such as aluminum (Al) or chrome (Cr) is used for the first electrode 870, the reflective plate may not be formed.

Figure 10C:
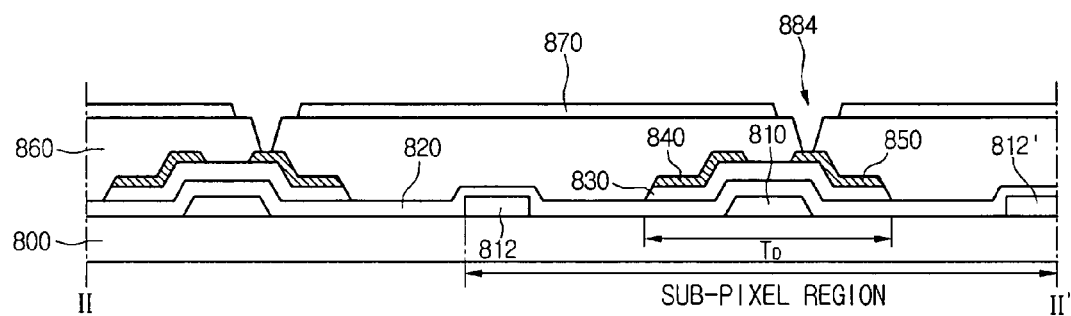

Referring to FIG. 10C, a contact hole 884 is formed at a predetermined region of the passivation layer 860 and the anode 870 so as to expose a drain electrode 850 of the drive TFT $T_D$. This connects the drain electrode 850 with a second electrode that will be formed later. Also, the contact hole 884 is formed only at a predetermined upper region of the drain electrode 850. Therefore, the first electrode 870 is entirely formed on all pixel regions on the substrate. That is, the first electrode 870 is formed on an entire surface except the region where the contact hole 884 is formed, such that it is connected pixel-to-pixel. In this embodiment, the contact hole 884 need not be formed on one end portion of the sub-pixel. Thus, the design margin of the contact hole and the degree of freedom can be ensured.

Figure 10D:
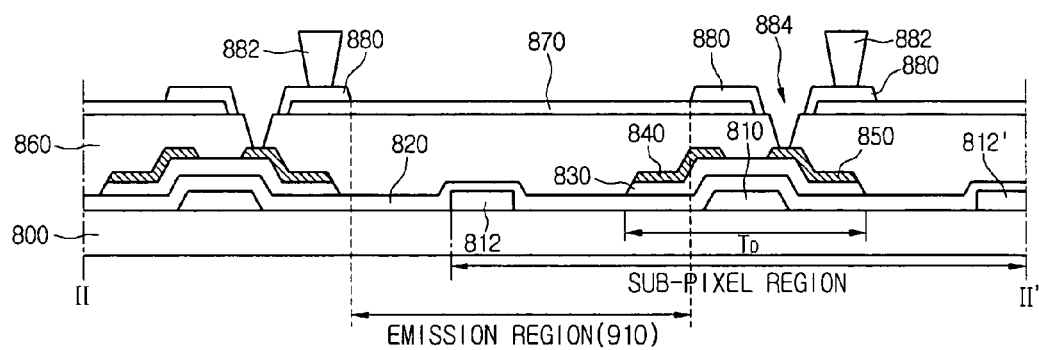

Referring to FIG. 10D, a buffer layer 880 and an electrode separator 882 are formed on a predetermined upper portion of the anode 870. The electrode separator 882 is not formed at the region overlapped with the gate lines 812 and 812' defining the sub-pixel because the electrode separator 882 does not function to separate the sub-pixel regions. Instead, the electrode separator 882 is misaligned from the gate lines 812 and 812' by a predetermined position. Thus, the electrode separator 882 separates the emission region 910 and the region including the contact hole. Also, the buffer layer 980 defines the region where the organic electro luminescent layer 890. In this embodiment, the emission region 910 where the organic electro luminescent layer 890 is formed is limited to the inside of the sub-pixel having the drive TFT.

Figure 10E:
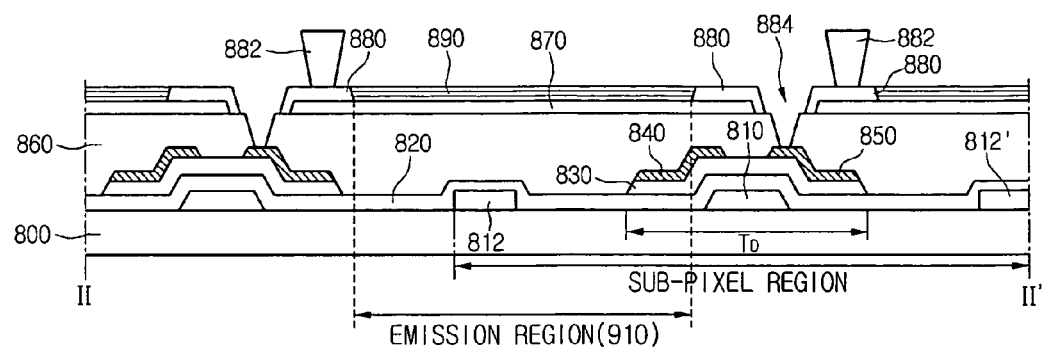

Referring to FIG. 10E, the organic electro luminescent layer 890 is formed within the region defined by the buffer layer 880. Although the organic electro luminescent layer 890 can be configured with a multi-layer or single-layer structure, the multi-layer structure is more usual. The organic electro luminescent layer 890 includes a hole injection layer (HIL), a hole transporting layer (HTL), an emission layer (EML), and an electron transporting layer (ETL), which are sequentially formed on the first electrode 870. Since the organic electro luminescent layer 890 is formed within the region defined by the buffer layer 880, it is not formed in the region where the contact hole 884 is formed.

Figure 10F:
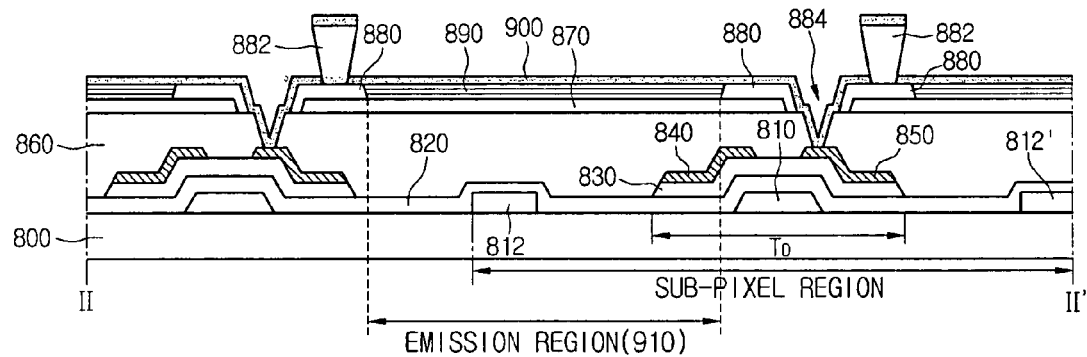

Referring to FIG. 10F, after the organic electro luminescent layer 890 is formed, a second electrode 900 of the organic electro luminescent diode is formed as a pixel electrode, such that the second electrode 900 and the drain electrode 850 are connected together through the contact hole 884. The second electrode 900 is separated by the electrode separator 882. Since a top emission type AMOLED can be used, metal used for the second electrode 900 may be a transparent metal. Also, metal having a thickness of 100 Å or less can be used.

In the AMOLED, the second electrode of the organic electro luminescent diode is connected to the drain electrode of the drive TFT provided at the pixel and thus the organic electro luminescent diode can maintain the conventional EL structure. Therefore, the organic electro luminescent device can be driven easily and stably.

Also, the sub-pixel region determined by the gate lines and the data lines is misaligned with the corresponding emission region by a predetermined position. Therefore, the degree of freedom and the design margin of the contact hole for connecting the drive TFT and the second electrode of the organic electro luminescent diode can be improved without reducing the emission region.

According to the AMOLED, the TFT for the driving element of each pixel is configured with the a-Si TFT and the second electrode (cathode) of the organic electro luminescent diode is connected to the drain electrode of the drive TFT, thereby providing the stable driving of the organic electro luminescent device.

Further, the sub-pixel region determined by the gate lines and the data lines is misaligned with the corresponding emission region by a predetermined position, thereby improving the degree of freedom and the design margin of the contact hole for connecting the drive TFT and the second electrode of the organic electro luminescent diode.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An organic electro luminescence device comprising:
   a thin film transistor (TFT) formed within a sub-pixel region defined by a gate line and a data line on a substrate;
   a passivation layer and a first electrode sequentially formed on the substrate where the TFT is formed;
   a contact hole formed at a predetermined portion of the passivation layer and the first electrode so as to expose a drain electrode of the TFT;
   an electrode separator and a buffer layer misaligned with the gate line by a predetermined position such that an emission region corresponding to the sub-pixel region and a region including the contact hole of the TFT are separated;
   an organic electro luminescent layer formed within a region defined by the buffer layer; and
   a second electrode formed on the organic electro luminescent layer and connected to the drain electrode of the TFT through the contact hole.

2. The organic electro luminescence device according to claim 1, wherein the TFT includes a gate electrode, a gate insulating layer, an active layer and source and drain electrodes, which are sequentially formed on the substrate.

3. The organic electro luminescence device according to claim 2, wherein the active layer is formed of amorphous silicon (a-Si) and the TFT is an n-type TFT.

4. The organic electro luminescence device according to claim 1, wherein the emission region includes:
   the second electrode;
   the organic electro luminescent layer formed below the second electrode; and
   the first electrode.

5. The organic electro luminescence device according to claim 1, wherein the emission region overlaps an adjacent sub-pixel region.

6. The organic electro luminescence device according to claim 1, wherein the sub-pixel region is misaligned with the corresponding emission region by a predetermined position.

7. The organic electro luminescence device according to claim 1, wherein the first electrode is formed in all sub-pixel regions except the region where the contact hole is formed.

8. The organic electro luminescence device according to claim 1, wherein the second electrode is divided by the electrode separator.

9. An organic electro luminescence device comprising:
   a substrate containing gate and data lines defining a sub-pixel region;
   a thin film transistor (TFT) formed in the sub-pixel region;
   a passivation layer formed on the substrate in the sub-pixel region;
   a first electrode formed on the passivation layer in the sub-pixel region;
   a buffer layer formed on the first electrode, adjacent buffer layers defining an emission region within the sub-pixel region;
   an organic electro luminescent layer formed on the first electrode within the emission region;
   a contact hole in a contact region exposing a drain electrode of the TFT through the buffer layer and passivation layer; and
   a second electrode formed on the organic electro luminescent layer and the buffer layer, the second electrode connected to the drain electrode of the TFT through the contact hole.

10. The organic electro luminescence device according to claim 9, further comprising an electrode separator disposed on the buffer layer over the gate lines, the electrode separator separating adjacent second electrodes.

11. The organic electro luminescence device according to claim 10, wherein the electrode separator is disposed over the data lines and surrounds the sub-pixel region.

12. The organic electro luminescence device according to claim 9, further comprising an electrode separator disposed on the buffer layer over the TFT, the electrode separator separating adjacent second electrodes.

13. The organic electro luminescence device according to claim 9, wherein a plurality of emission regions are formed within the sub-pixel region.

14. The organic electro luminescence device according to claim 13, wherein the emission regions are substantially the same size.

15. The organic electro luminescence device according to claim 14, wherein the contact region is formed substantially at a center of the sub-pixel region and separates the emission regions.

16. The organic electro luminescence device according to claim 9, wherein a single emission region is formed within the sub-pixel region.

17. The organic electro luminescence device according to claim 16, wherein the contact region is formed substantially at a corner of the sub-pixel region.

18. The organic electro luminescence device according to claim 9, wherein the emission region overlaps an adjacent sub-pixel region.

19. The organic electro luminescence device according to claim 18, further comprising an electrode separator disposed on the buffer layer over the data lines, the electrode separator separating adjacent second electrodes.

20. The organic electro luminescence device according to claim 19, wherein the electrode separator extends parallel to the gate lines and crosses but does not extend along the gate lines.

21. The organic electro luminescence device according to claim 20, wherein a single emission region is formed within a region bounded by the electrode separator.

22. The organic electro luminescence device according to claim 21, wherein the contact region is formed substantially at a corner of the region bounded by the electrode separator.

* * * * *